(12) United States Patent
Sakamoto et al.

(10) Patent No.: US 9,086,440 B2
(45) Date of Patent: Jul. 21, 2015

(54) CURRENT SENSOR

(71) Applicant: Yazaki Corporation, Tokyo (JP)

(72) Inventors: Akinori Sakamoto, Shimada (JP); Shidi Peng, Shimada (JP)

(73) Assignee: Yazaki Corporation, Tokyo (JP)

( * ) Notice: Subject to any disclaimer, the term of this patent is extended or adjusted under 35 U.S.C. 154(b) by 137 days.

(21) Appl. No.: 13/903,166

(22) Filed: May 28, 2013

(65) Prior Publication Data

US 2013/0320968 A1 Dec. 5, 2013

(30) Foreign Application Priority Data

May 31, 2012 (JP) ................................ 2012-125296

(51) Int. Cl.
*G01R 33/00* (2006.01)
*G01R 1/18* (2006.01)
*G01R 15/20* (2006.01)

(52) U.S. Cl.
CPC .............. *G01R 33/0094* (2013.01); *G01R 1/18* (2013.01); *G01R 15/207* (2013.01)

(58) Field of Classification Search
CPC ........... G01R 31/3606; G01R 19/0092; G01R 27/02; G01R 27/2605; G01R 31/2837; G01R 35/005; G01R 19/00; G01R 19/0061; G01R 19/252; G01R 1/04; G01R 1/0491; G01R 1/067; G01R 1/06705; G01R 1/06711
USPC .......................... 324/117, 126, 127, 244, 253
See application file for complete search history.

(56) References Cited

U.S. PATENT DOCUMENTS

| | | | |
|---|---|---|---|
| 8,203,328 B2 * | 6/2012 | Bose et al. ................ | 324/117 H |
| 8,237,435 B2 * | 8/2012 | Hashio et al. ................. | 324/244 |
| 8,493,165 B2 * | 7/2013 | Misaki .......................... | 335/219 |
| 8,709,627 B2 * | 4/2014 | Matsushima et al. ........... | 429/65 |
| 2008/0094060 A1 * | 4/2008 | Muraki et al. ................. | 324/252 |
| 2009/0121704 A1 * | 5/2009 | Shibahara ................. | 324/117 R |
| 2011/0050222 A1 * | 3/2011 | Ueno et al. .................... | 324/253 |
| 2013/0169267 A1 * | 7/2013 | Miyakoshi et al. ....... | 324/117 R |
| 2014/0049255 A1 * | 2/2014 | Kitamoto ...................... | 324/244 |

FOREIGN PATENT DOCUMENTS

JP    2010-002277 A    1/2010

* cited by examiner

*Primary Examiner* — Tung X Nguyen
*Assistant Examiner* — Akm Zakaria
(74) *Attorney, Agent, or Firm* — Sughrue Mion, PLLC

(57) ABSTRACT

A current sensor is disclosed which detects current values of bus bars through which three phase alternating currents flow, including shields which are provided for each of the bus bars, a flat board on which magnetic detecting elements corresponding to respective phases are mounted, and a housing inside which the shields and the board are accommodated, wherein the housing is formed with storage parts to store the shield, the board is formed with concave parts recessed in a direction opposite to the direction the board is assembled, the shields are formed with cut parts recessed in the direction the board is assembled, at parts that intersect with the board when the shields and the board are accommodated, and when the shields and the board are accommodated, a part of the board is located in the cut parts, and a part of the shields is located in the concave parts.

5 Claims, 6 Drawing Sheets

CURRENT SENSOR

BACKGROUND OF THE INVENTION

The present invention relates to a current sensor which detects the current values in current paths through which three phase alternating currents flow respectively.

In recent years, with the downsizing of electronic devices, a current sensor which is attached to bus bars easily is necessary. A current sensor is known which detects the current values of respective phases of three phase alternating currents that flow in bus bars (refer to a patent document 1).

A current sensor 100 of the patent document 1 includes a housing 200, a cover 300 which covers the housing 200, shields 400 which are assembled in the housing 200, a board 500 and the bus bars 600, as shown in FIG. 6. The assembling procedures are as follows. First, the shields 400 are arranged in receiving parts 201 formed in the housing 200, and the bus bars 600 are arranged in accordance with recesses 202 to penetrate through the shields 400. The bus bars 600 are formed with cuts 601, and the positioning in the longitudinal direction is performed by engaging the cuts 601 with walls that define the recesses 202.

After the bus bars 600 are arranged, the board 500 on which magnetic detecting elements 510 of respective phases are loaded is arranged on the bus bars 600. At this time, guide parts 501 of the board 500 pass between the recesses 203. Thereby, the board 500 and the magnetic detecting elements 510 are surely positioned relative to the bus bars 600. Finally, by fitting the cover 300 to the housing 200, the assembly is completed.

RELATED ART DOCUMENTS

Patent Documents

[Patent document 1] Japanese Patent Publication No. 2010-2277

In the current sensor 100 described in the patent document 1, the shields 400 are positioned in the housing 200 surely by attaching the bus bars 600 and the board 500 to the housing 200. However, in the traditional current sensor, the board 500 must be attached after having assembled the bus bars 600. Therefore, a demand to attach the current sensor to the bus bars later cannot be met, and applications to which the traditional current sensor can be applied are limited. Further, in the traditional current sensor, because a step of assembling the bus bars 600 in the housing 300 is necessary, the operativity of assembling the current sensor is inferior.

If the bus bars 600 are simply removed from the traditional current sensor, because the board 500 and the magnetic detecting elements 510 are positioned relative to the bus bars 600, the precision with which the magnetic detecting elements 510 and the shields 400 are positioned is decreased. In light of that the position relationship between the magnetic detecting elements 510 and the shields 400 must be exact to improve current detection precision and to prevent magnetic interference from an adjacent phase, a drop of the positioning precision cannot be permitted.

SUMMARY

The present invention is made in view of the above circumstances, and the object of the present invention is to provide a current sensor which can maintain the positioning precision of shield and magnetic detecting elements, and can be assembled easily to bus bars.

To achieve the previously described object, the current sensor according to the present invention is characterized by the following (1) to (4).

(1) A current sensor which detects current values of bus bars through which three phase alternating currents flow, respectively, comprising shields which are provided for each of the bus bars, a flat board on which magnetic detecting elements corresponding to respective phases are mounted, and a housing inside which the shields and the board are accommodated, wherein the housing is formed with storage parts in which the shield are stored, the board is formed with concave parts that are recessed in a direction opposite to the direction the board is assembled to the housing, the shields are formed with cut parts that are recessed in the direction the board is assembled to the housing, at parts that intersect with the board when the shields and the board are accommodated inside the housing, and when the shields and the board are accommodated inside the housing, a part of the board is located in the cut parts of the shields, and a part of the shields is located in the concave parts of the board.

(2) The current sensor according to the above (1), wherein the housing is provided with through holes through which the bus bars are inserted.

(3) The current sensor according to the above (2), wherein the storage parts are formed between vertical walls that are formed inside the housing and outer walls that define the through holes.

(4) The current sensor according to the above (1), wherein the board is formed into one piece of flat board.

According to the current sensor of the above (1), because the shields are fixed in the housing surely, the relative positional relationship between the shields and the bus bars are fixed precisely. Because the board and the shields are positioned by the concave parts formed in the board and the cut parts of the shields, the relative positional relationship between the board and the shields is fixed. Because of the positional relationships among the shields, the bus bars and the board, the current sensor whose current detection performance is stable, whose vibration resistance is superior and which can be easily assembled can be provided.

According to the current sensor of the above (2), because the bus bars are inserted through the assembled current sensor, the area where the current sensor can be applied is broadened.

According to the current sensor of the above (3), a structure to fix the shields to the housing can be realized easily.

According to the current sensor of the above (4), the number of components can be reduced.

The present invention has been briefly described above. Further, details of the invention will become more apparent after embodiments of the invention described below (hereinafter referred to as "embodiments") are read with reference to the accompanying figures.

BRIEF DESCRIPTION OF THE DRAWINGS

FIGS. 2A and 2B are exploded perspective views which show in detail that the current sensor of FIG. 1 is assembled, in which FIG. 2A shows a position relationship between a shield and a housing, and FIG. 2B shows a positional relationship between the shield and a board.

FIGS. 5A and 5B are perspective views which show states of assembling the current sensor of FIG. 1, in which FIG. 5A shows a state before a cover is assembled, and FIG. 5B shows a state after the cover is assembled.

DETAILED DESCRIPTION OF EMBODIMENTS

Preferred embodiments of the present invention will be described below in detail with reference to the figures.

A current sensor which is one embodiment of the present invention is described based on FIGS. 1 to 5B.

Figure 1:
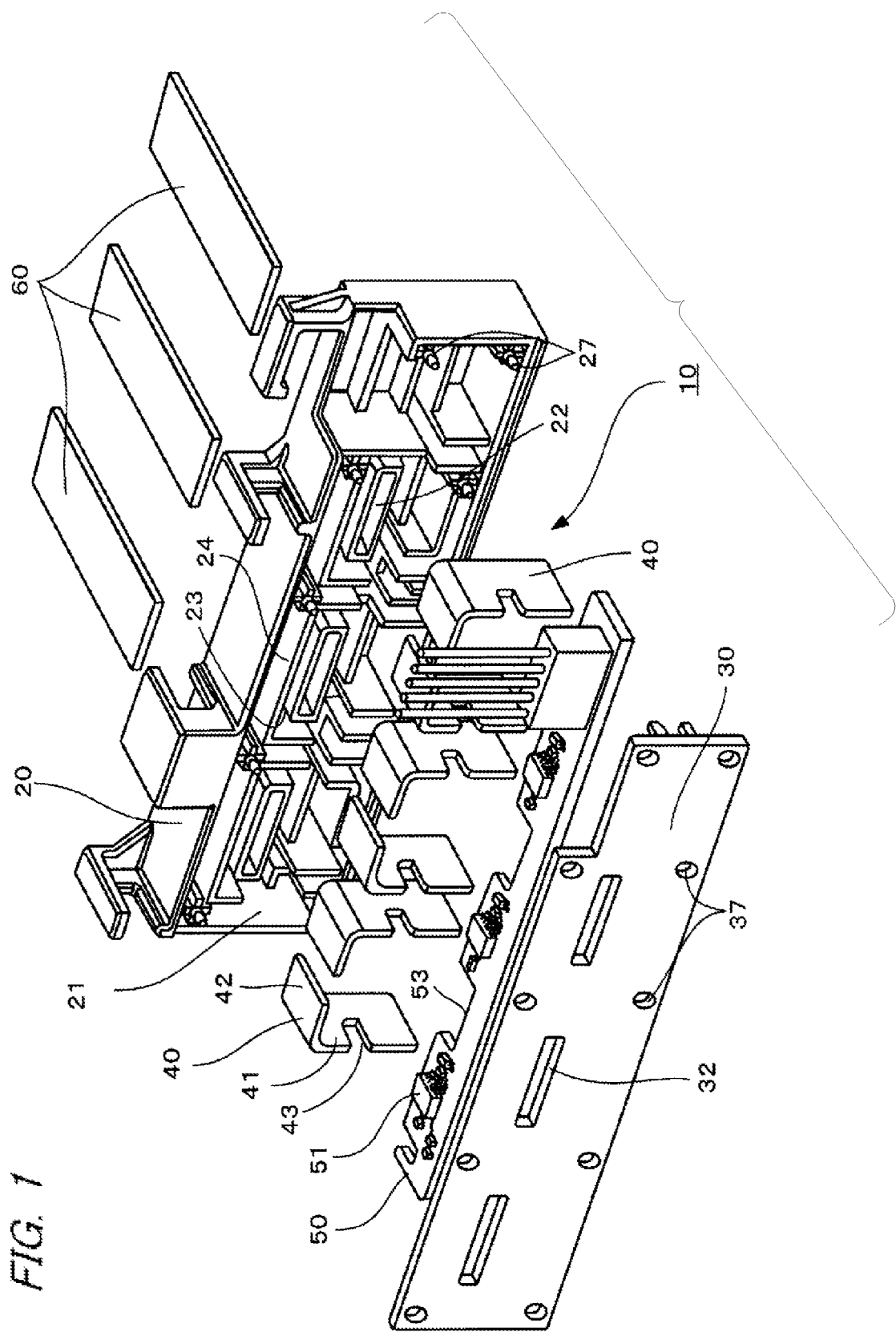
FIG. 1 is an exploded perspective view which shows one embodiment of the current sensor according to the present invention.

FIG. 1 is an exploded perspective view of a current sensor 10. The current sensor 10 which is an embodiment of the present invention detects the current values of bus bars through which respective phases of three-phase alternating currents flow, respectively. The current sensor 10 includes a housing 20, shields 40 which are assembled in the housing and a board 50. Further, the current sensor 10 includes a cover 30 which covers an opening part 21 of the housing. A circuit for sending current detecting signals and magnetic detecting elements 51 are mounted on the board 50. The current sensor 10 detects currents that flow through three bus bars 60 which are inserted through the current sensor 10. For example, the current sensor 10 is attached to a current path that connects the in-vehicle battery of an automobile and vehicle electrical components.

The housing 20 and the cover 30 are formed roughly into a box shape, and are molded of insulating synthetic resin or the like. The board 50 is formed into one piece of flat board, and the magnetic detecting elements 51, each of which corresponds to one phase, are mounted on the board 50 to detect the respective phase electric currents of the bus bars 60. In the embodiment, three magnetic detecting elements 51 are mounted on one board 50. The shields 40 are made from materials of high magnetic permeability such as iron, permalloy or silicon steel sheet, and are formed into thin plates. The shields 40 of the present embodiment are formed in pairs, and each pair includes a right part and a left part each of which include a support column part 41 that extends in the vertical direction and a bent part 42 which extends from the distal end of the support column part 41 in a direction roughly perpendicular to the vertical direction. The shape of the shields 40 is not particularly limited to the embodiment, and may only have the support column part 41. The right part and the left part may be integrated. The shields 40 are provided for each of the bus bars 60.

The magnetic detecting elements 51 are elements that measure magnetic fields produced with the bus bars 60, and are, for example, semiconductor Hall elements using Hall-effect produced by Lorentz forces that carriers in the magnetic fields receive, or magnetic impedance elements using magnetic impedance effect of amorphous wires. The current sensor 10 outputs voltage values proportional to the magnetic fields detected with the magnetic detecting elements 51 through amplification circuits mounted on the board 50.

The plurality of bus bars 60 through which the respective phases of the three-phase alternating currents flow are conductors or the like formed on flat boards through which alternating currents flow, and are arranged above the magnetic detecting elements 51 by being inserted through a plurality of through holes 22 formed in the housing 20 and a plurality of opening holes 32 formed in the cover 30, respectively.

The relationship between the components and steps of assembling the components are described using an exploded perspective view of FIG. 2.

Figure 2A:
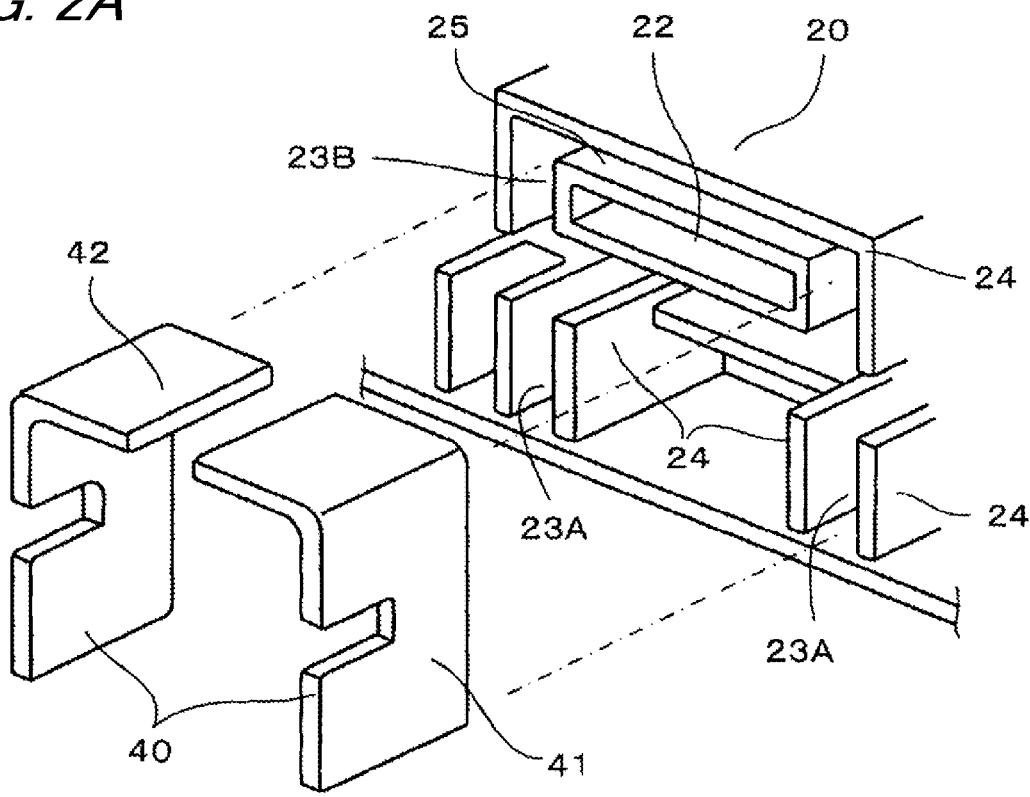

First, using the exploded perspective view of FIG. 2A, structures for assembling the shields 40 and the housing 20 are described. The housing 20 is provided with a plurality of storage parts 23 into which the shields 40 are press-fitted. Because the width of the storage parts 23 is formed to be approximately equal to the thickness of the shields 40, when the shields 40 are press-fitted into the storage parts 23, the shields 40 are fixed in the housing 20. The storage parts 23 are roughly divided to include two kinds of spaces. There are a storage part 23A which is formed between surfaces of a plurality of vertical walls 24 which are projected upwards from the bottom surface of the housing 20 and formed integrally with the housing 20 (between two vertical walls 24), and a storage part 23B which is formed between the plurality of vertical walls 24 and outer walls 25 that define the through hole 22. The storage part 23A holds the support column part 41 of the shield 40, and the storage part 23B holds the bent part 42.

Figure 2B:
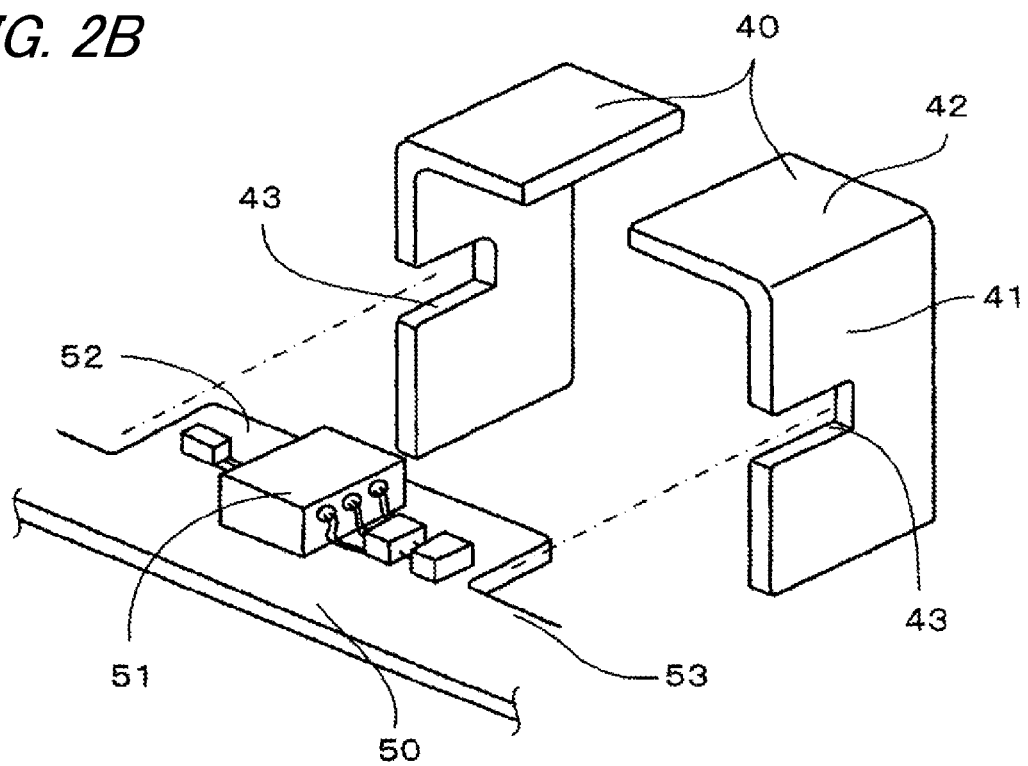

Then, using the exploded perspective view of FIG. 2B, structures for assembling the shields 40 and the board 50 are described. One side part of the support column part 41 of the shield 40 is formed with a cut part 43 which is recessed in a direction the board 50 is assembled to the housing 20. The position where the shield 40 is formed with the cut part 43 corresponds to a part that intersects with the board 50 when the shields 40 and the board 50 are accommodated inside the housing 20.

Although the magnetic detecting elements 51 are mounted on the board 50, some electronic components and circuits adjacent to the magnetic detecting elements 51 are also mounted on the board 50. Although it is necessary to secure these mounting regions 52 to have some area necessary for mounting, parts other than the mounting regions 52 are formed with a narrow width. In other words, in comparison with the mounting regions 52, the parts formed with a narrow width are recessed in a direction opposite to the direction the board 50 is assembled in the housing 20. The parts formed with a narrow width are assumed as concave parts 53. By aligning the positions of the cut parts 43 of the shields 40 with those of the concave parts 53, namely, by making the shields 40 and the board 50 relatively approach so that a part of the board 50 is located in the cut parts 43 of the shields 40, and a part of the shields 40 is located in the concave parts 53 of the board 50, the magnetic detecting element 51 is arranged between a pair of shields 40 and the relative positional relationship between the bent parts 42 of the shields 40 and the magnetic detecting element 51 is fixed. At this time, the cut parts 43 of the shields 40 and the concave parts 53 of the board 50 may come into contact with each other or engage with each other.

Figure 3:
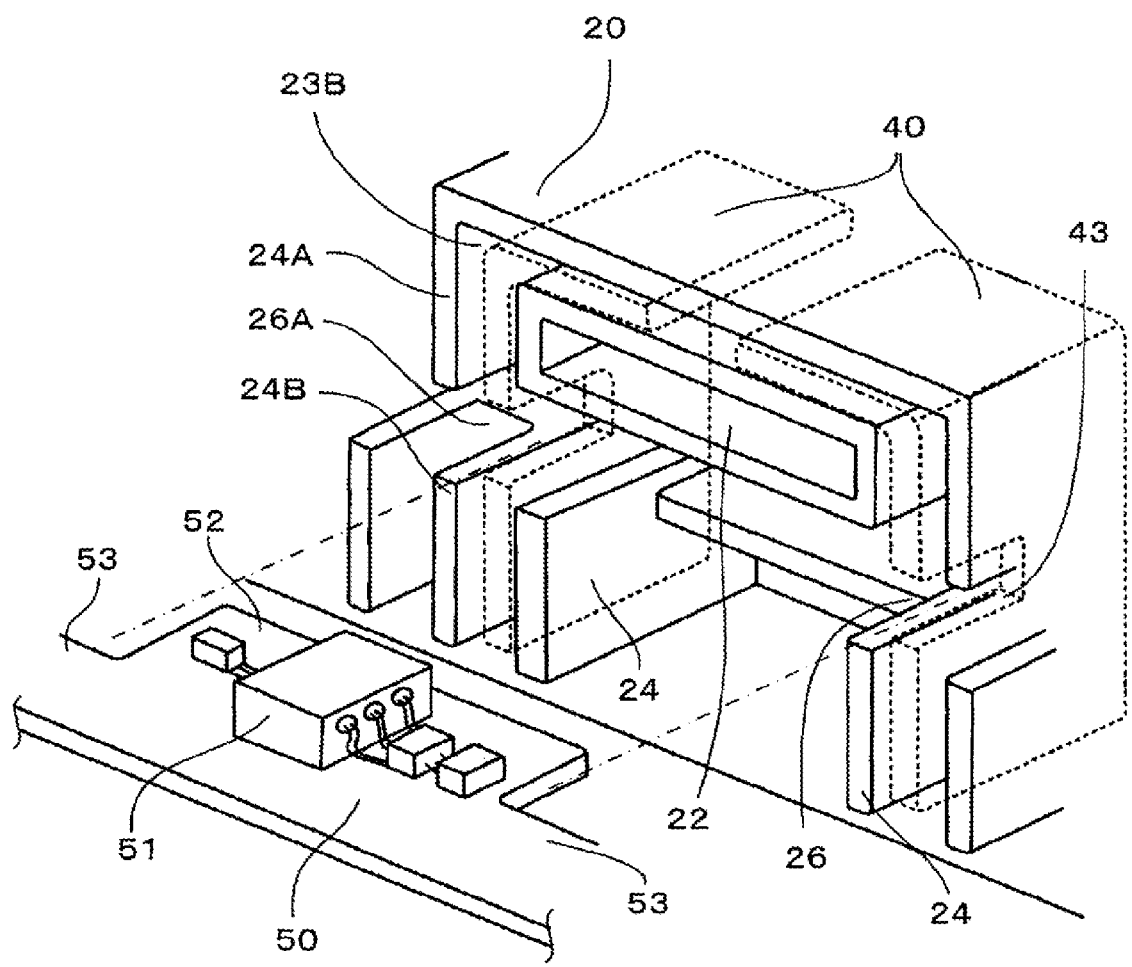
FIG. 3 is an exploded perspective view which shows that the board is assembled to the housing of FIG. 1.
Figure 4:
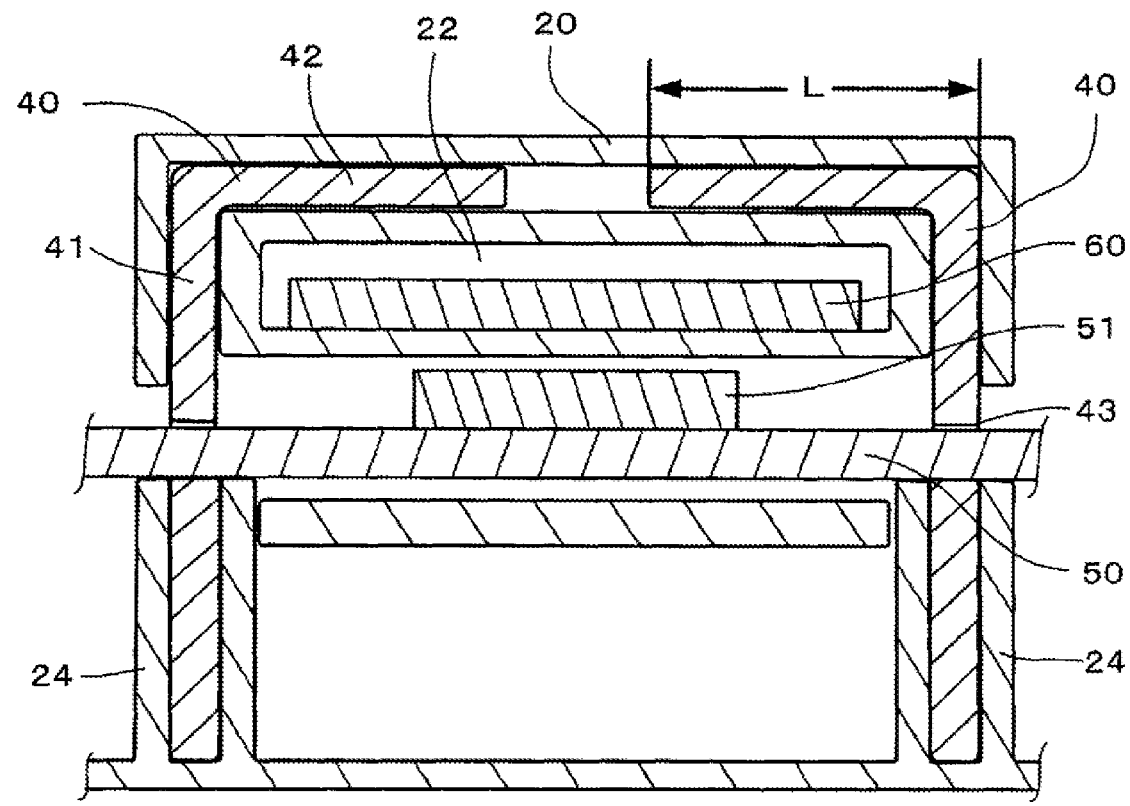
FIG. 4 is a partial sectional view after the current sensor of FIG. 1 was assembled.

In the exploded perspective view of FIG. 3, the shields 40 which are press-fitted and fixed in the housing 20 are virtually indicated with dotted lines. The shields 40 are press-fitted in the housing 20 and the board 50 is assembled inside the housing 20. The concave parts 53 of the board 50 and the cut parts 43 of the shields 40 are positioned, and locked in a plurality of support parts 26 formed between the upper side and the lower side of the vertical walls 24. In the embodiment of FIG. 3, a support part 26A is formed between vertical walls 24A and 24B.

A sectional view in which the shields 40 and the board 50 are assembled, and the bus bars 60 are inserted through the through holes 22 as described above is shown in FIG. 4. The bus bar 60 is arranged above the magnetic detecting element 51, and the shields 40 are arranged to surround the bus bar 60 and the magnetic detecting element 51. The bent parts 42 of the shields 40 have a length L and project towards the center of the through hole 22. By arranging the shields 40 and the magnetic detecting elements 51 as above, the current sensor 10 detects the currents flowing through the bus bars 60.

According to the current sensor 10 of the present invention, because the shields 40 are fixed in the housing 20 surely, the relative positional relationship between the shields 40 and the bus bars 60 are fixed precisely to stably detect currents and prevent magnetic interference. Because the concave parts 53 formed in the board 50 and the cut parts 43 of the shields 40 are positioned, the relative positional relationship between the board 50 and the shields 40 is fixed. Because of the positional relationships among these shields 40, the board 50 and the bus bars 60, the current sensor 10 whose current detection performance is stable, whose vibration resistance is superior and which can be easily assembled can be provided. Because three magnetic detecting elements 51 are mounted on one piece of the board 50, it is not necessary to make boards 50 individually for three phases, the number of components is reduced, and the cost is reduced.

Figure 5A:
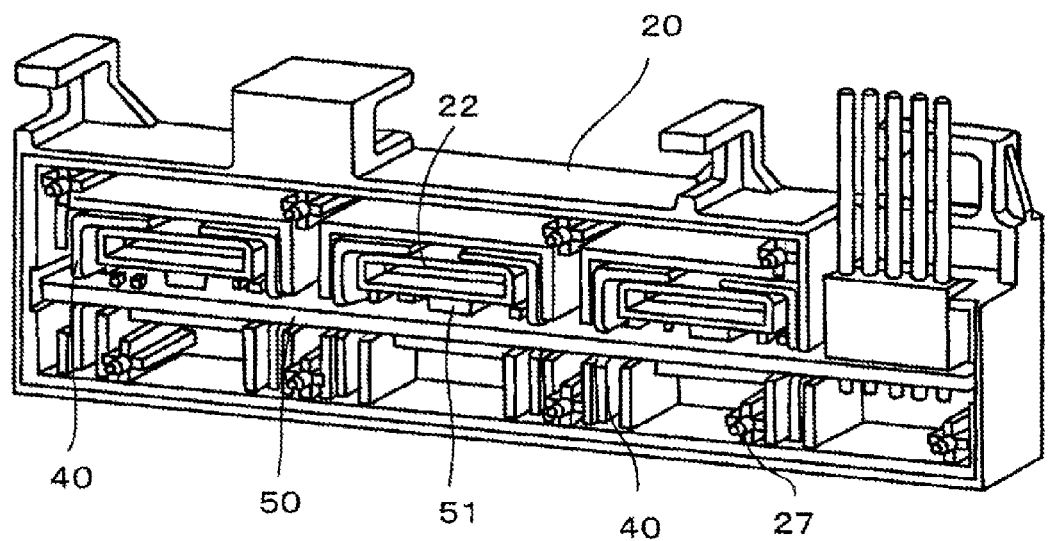
Figure 5B:
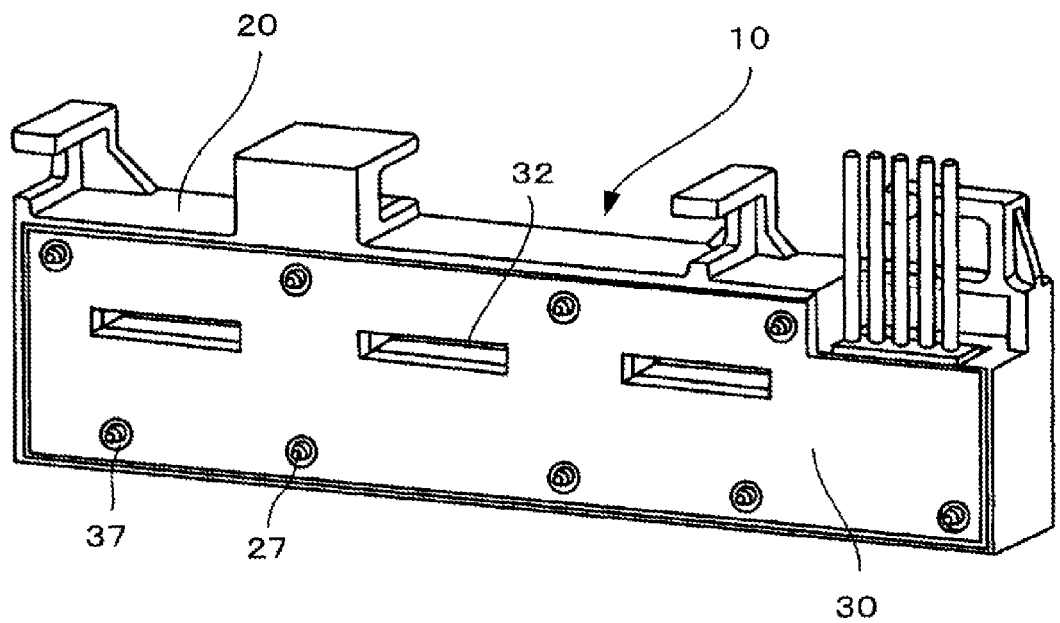
Figure 6:
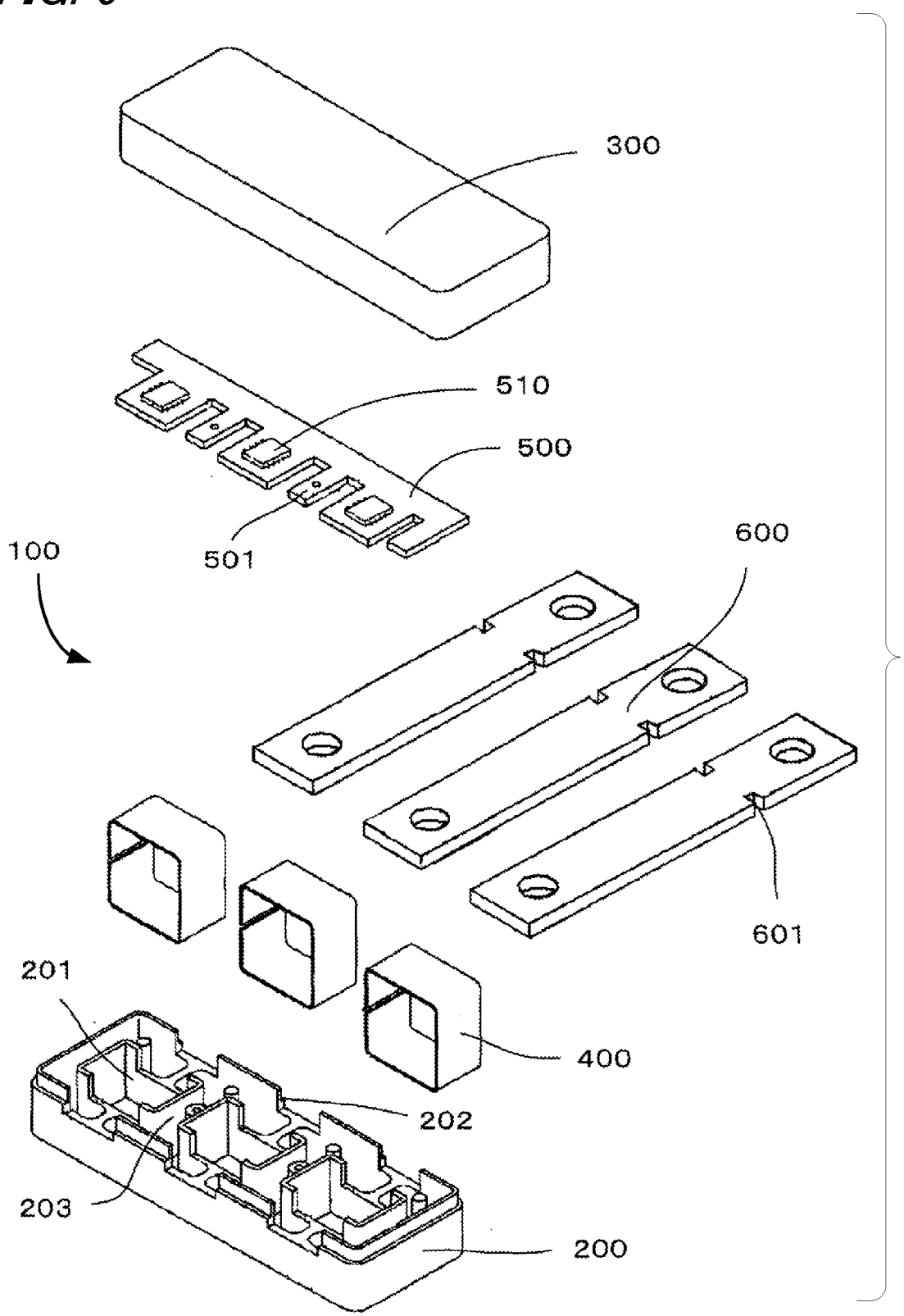
FIG. 6 is an exploded perspective view of a traditional current sensor.

The perspective view of FIG. 5A shows that the plurality of shields 40 and one piece of the board 50 on which the magnetic detecting elements 51 are mounted are assembled in the housing 20. The perspective view of FIG. 5B shows that the cover 30 is assembled to the opening part 21 of the housing 20. When a plurality of projections 27 formed at the housing 20 are inserted through a plurality of holes 37 formed in the cover 30, and the distal ends of the projections 27 are heat melted, the cover 30 is fixed to the housing 20. With such a fixing structure, the board 50 or the like is prevented from getting out from the housing. The means for fastening the cover 30 to the housing 20 is not particularly limited to the embodiment, and, for example, it is possible to fasten with screws or bolts, or the cover 30 is heat welded at the opening part 21. Further, an engaging means is also possible if the vibration resistance is secured.

As mentioned above, because the bus bars 60 are inserted through the plurality of through holes 22 formed in the housing 20 and the plurality of opening holes 32 formed in the cover 30 after the components of the current sensor 10 are assembled, the area where the current sensor can be applied is broadened.

The present invention is not limited to the above described embodiment, and suitable modifications, improvements or the like can be made. Moreover, the materials, shapes, dimensions, numerical values, forms, numbers, installation arranges and the like of the components are arbitrarily set as far as the invention can be attained, and not particularly restricted.

According to the present invention, by fixing the shields in the housing, and positioning the shields and the board on which the magnetic detecting elements are mounted, a stably precise current detection can be realized, and a current sensor to which bus bars can be assembled easily can be provided.

What is claimed is:
1. A current sensor which detects current values of bus bars through which three phase alternating currents flow, respectively, comprising
    shields which are provided for each of the bus bars,
    a flat board on which magnetic detecting elements corresponding to respective phases are mounted, and
    a housing inside which the shields and the board are accommodated,
    wherein
    the housing is formed with storage parts in which the shield are stored,
    the board is formed with concave parts that are recessed in a direction opposite to the direction the board is assembled to the housing,
    the shields are formed with cut parts that are recessed in the direction the board is assembled to the housing, at parts that intersect with the board when the shields and the board are accommodated inside the housing, and
    when the shields and the board are accommodated inside the housing, a part of the board is located in the cut parts of the shields, and a part of the shields is located in the concave parts of the board.
2. The current sensor according to claim 1, wherein
the housing is provided with through holes through which the bus bars are inserted.
3. The current sensor according to claim 2, wherein
the storage parts are formed between vertical walls that are formed inside the housing and outer walls that define the through holes.
4. The current sensor according to claim 1, wherein
the board is formed into one piece of flat board.
5. The current sensor according to claim 1, wherein
when the shields, the board, and the bus bars are accommodated inside the housing, the shields surround the respective bus bar and corresponding magnetic detecting element.

* * * * *